United States Patent
Gore

(10) Patent No.: US 9,165,704 B2
(45) Date of Patent: Oct. 20, 2015

(54) SUPERCONDUCTING MAGNET APPARATUS WITH CRYOGEN VESSEL

(71) Applicant: SIEMENS PLC, Camberley (GB)

(72) Inventor: Russell Peter Gore, Abingdon (GB)

(73) Assignee: Siemens PLC, Camberley (GB)

( * ) Notice: Subject to any disclaimer, the term of this patent is extended or adjusted under 35 U.S.C. 154(b) by 0 days.

(21) Appl. No.: 14/401,206

(22) PCT Filed: Jun. 4, 2013

(86) PCT No.: PCT/EP2013/061480
§ 371 (c)(1),
(2) Date: Nov. 14, 2014

(87) PCT Pub. No.: WO2013/186085
PCT Pub. Date: Dec. 19, 2013

(65) Prior Publication Data
US 2015/0099639 A1  Apr. 9, 2015

(30) Foreign Application Priority Data

Jun. 12, 2012 (GB) .................................. 1210291.9

(51) Int. Cl.
*H01F 6/04* (2006.01)
*H01F 6/06* (2006.01)
*G01R 33/3815* (2006.01)
*F17C 1/00* (2006.01)

(52) U.S. Cl.
CPC .............. *H01F 6/04* (2013.01); *G01R 33/3815* (2013.01); *H01F 6/06* (2013.01); *F17C 1/00* (2013.01)

(58) Field of Classification Search
CPC ......... G01R 33/3815; H01F 6/06; H01F 6/04; F17C 1/00

USPC .......................................................... 335/216
See application file for complete search history.

(56) References Cited

U.S. PATENT DOCUMENTS

| | | | |
|---|---|---|---|
| 3,151,365 A | | 10/1964 | Emslie |
| 3,363,207 A | * | 1/1968 | Brechna ........................ 335/216 |
| 3,408,619 A | * | 10/1968 | Schrader ....................... 335/216 |
| 3,428,925 A | * | 2/1969 | Bogner et al. ................ 335/216 |
| 3,534,308 A | * | 10/1970 | Drautman, Jr. ............... 335/216 |
| 4,935,714 A | * | 6/1990 | Vermilyea ..................... 505/211 |

(Continued)

FOREIGN PATENT DOCUMENTS

| | | |
|---|---|---|
| EP | 1953772 A2 | 8/2008 |
| GB | 2087061 A | 5/1982 |

(Continued)

*Primary Examiner* — Mohamad Musleh
(74) *Attorney, Agent, or Firm* — Schiff Hardin LLP

(57) ABSTRACT

In a superconducting magnet apparatus, at least one superconducting winding and an outer vacuum chamber are provided. A thermal radiation shield is located between the superconducting winding and the outer vacuum chamber. A cryogen vessel is positioned within the thermal radiation shield and within the outer vacuum chamber. The superconducting winding is positioned outside of the cryogen vessel. A refrigerator is operable to cool the cryogen vessel to a liquid cryogen temperature and to cool the at least one thermal radiation shield to an intermediate temperature between the liquid cryogen temperature and a temperature of the outer vacuum chamber. A substantial portion of an outer surface of the cryogen vessel has a thermal emissivity at the liquid cryogen temperature which is greater than an average surface emissivity of the superconducting winding by at least 0.1.

18 Claims, 6 Drawing Sheets

(56) References Cited

U.S. PATENT DOCUMENTS

| | | | |
|---|---|---|---|
| 5,424,702 A | 6/1995 | Kameoka et al. | |
| 5,884,489 A * | 3/1999 | Retz et al. | 62/51.1 |
| 2005/0146407 A1 * | 7/2005 | Watanabe et al. | 335/216 |
| 2006/0218942 A1 * | 10/2006 | Atkins et al. | 62/51.1 |
| 2007/0120631 A1 * | 5/2007 | Hobbs et al. | 335/216 |
| 2008/0246567 A1 | 10/2008 | Isogami et al. | |
| 2009/0277517 A1 * | 11/2009 | Mann | 137/486 |
| 2010/0148593 A1 | 6/2010 | Ohashi et al. | |
| 2011/0056218 A1 * | 3/2011 | Blakes | 62/51.1 |

FOREIGN PATENT DOCUMENTS

| | | |
|---|---|---|
| GB | 2427669 A | 1/2007 |
| GB | 2454268 A | 5/2009 |
| GB | 2459104 A | 10/2009 |
| JP | 2002222806 A | 8/2002 |
| JP | 2008192848 A | 8/2008 |
| JP | 2011176905 A | 9/2011 |
| JP | 5082337 B2 | 11/2012 |
| JP | 5231101 B2 | 7/2013 |

* cited by examiner

SUPERCONDUCTING MAGNET APPARATUS WITH CRYOGEN VESSEL

BACKGROUND

Conventional arrangements for cooling superconducting magnets include a cryogen vessel partly filled with a bath of liquid cryogen such as helium. Windings of the superconducting magnet are partially immersed in the liquid cryogen, to hold them at a temperature of approximately the boiling point of the cryogen.

Such arrangements provide a quasi-isothermal environment within the cryogen vessel. Ambient heat is prevented from reaching the windings by a cryostat comprising the cryogen vessel, an outer vacuum chamber (OVC) enclosing the cryogen vessel and mechanical supports arranged to retain the magnet, the cryogen vessel and the OVC in required relative positions. One or more thermal radiation shields are typically provided in the space between the cryogen vessel and the OVC.

The vacuum within the OVC minimizes convection losses, and thermal conduction through the mechanical supports is minimized by appropriate material choice and dimensions. Such thermal conduction as remains may be intercepted by an active cooler such as a cryogenic refrigerator thermally linked to the shield(s) and/or the cryogen vessel.

Through careful design, the thermal influx reaching the "cold mass", that is, the liquid cryogen and everything in contact with it, may be reduced to less than 1 W. Even so, care must be taken to ensure that this thermal influx does not reach the superconducting windings. Partial immersion in liquid cryogen, such as helium, together with convection cooling and recondensation of cryogen vapor by a cryogenic refrigerator conventionally ensures that the thermal influx does not reach the superconducting windings.

An outer surface of the cryogen vessel may be coated in a low emissivity coating, such as aluminum foil, which will reflect thermal radiation reaching the cryogen vessel, contributing to keeping the thermal influx away from the superconducting windings.

Conventional design philosophy has been to minimize the surface area of cryogen vessels, and to insulate them from incident radiant heat, including by applying highly reflective, low thermal emissivity surface coatings to reflect incident thermal radiation.

As used herein, the term "thermal radiation" and similar terms are used to refer to electromagnetic radiation in the thermal infra-red range of wavelengths, approximately 8 to 14 micrometers. The terms "thermal emissivity" and similar terms are used to refer to emissivity of thermal radiation.

More recently, superconducting magnet cooling arrangements have been devised which do not require a cryogen vessel containing a bath of liquid cryogen. Local coil cooling solutions are provided instead. For example, pipe cooled systems, sometimes referred to as cooling loops, may involve relatively small quantities of liquid cryogen such as helium circulating from a small cryogen reservoir through pipe and manifold systems in thermal contact with the superconducting windings.

FIG. 1 shows a cross-section through a conventional superconducting magnet cooling arrangement employing a local coil cooling solution. A hollow cylindrical OVC 10 is provided, housing superconducting magnet windings 20. A thermal radiation shield 12 is provided within the OVC, and solid-state thermal insulation 14, such as multi-layer aluminized polyester sheet known as Superinsulation® may be provided between the OVC inner surface and the outer surface of the thermal radiation shield.

The local coil cooling solution typically, and as illustrated, comprises a cryogen vessel 22 provided with access turret 24 and an external refrigerator 26, thermally linked by thermal bus 28 to a recondenser (not visible) exposed to the interior of the cryogen vessel 22. In alternative arrangements, a refrigerator may be connected directly to the cryogen vessel. The cryogen vessel 22 provides cooled, preferably liquid, cryogen through a tube 30 to a manifold 32. The manifold distributes the cooled cryogen to cooling loops arranged in thermal contact with superconducting windings of the magnet, which cooling loops operate according to the conventional and well-documented thermal convection method.

Attempts may be made to further shield the magnet windings 20 from radiant heat emitted by the inner surface of the thermal radiation shield 12, or other surfaces. For example, the magnet windings may be wrapped in a tape of low-emissivity material. However, such attempts have not been found to be completely successful. A certain amount of heat has always been found to make its way between turns of tape, or otherwise, to the structure shielded by the tape.

All heat reaching the interior of the thermal radiation shield(s) may impinge upon, and be absorbed by, the windings themselves. A small cryogen reservoir used in such a system may itself be coated in a low thermal emissivity coating, but this will not reduce the incidence of thermal radiation onto the superconducting windings, unlike such a coating applied to the cryogen vessel of conventional cryogen-bath arrangements.

SUMMARY

It is an object to provide an improved superconducting magnet cooling arrangement in which the incidence of thermal radiation impinging onto the superconducting windings themselves is reduced.

In a superconducting magnet apparatus, at least one superconducting winding and an outer vacuum chamber are provided. A thermal radiation shield is located between the superconducting winding and the outer vacuum chamber. A cryogen vessel is positioned within the thermal radiation shield and within the outer vacuum chamber. The superconducting winding is positioned outside of the cryogen vessel. A refrigerator is operable to cool the cryogen vessel to a liquid cryogen temperature and to cool the at least one thermal radiation shield to an intermediate temperature between the liquid cryogen temperature and a temperature of the outer vacuum chamber. A substantial portion of an outer surface of the cryogen vessel has a thermal emissivity at the liquid cryogen temperature which is greater than an average surface emissivity of the superconducting winding by at least 0.1.

These, and other, objects, characteristics and advantages of the present invention will become more apparent from consideration of the following description of certain embodiments, given by way of non-limiting examples only, in conjunction with the appended drawings.

DESCRIPTION OF EXEMPLARY EMBODIMENTS

Figure 1:
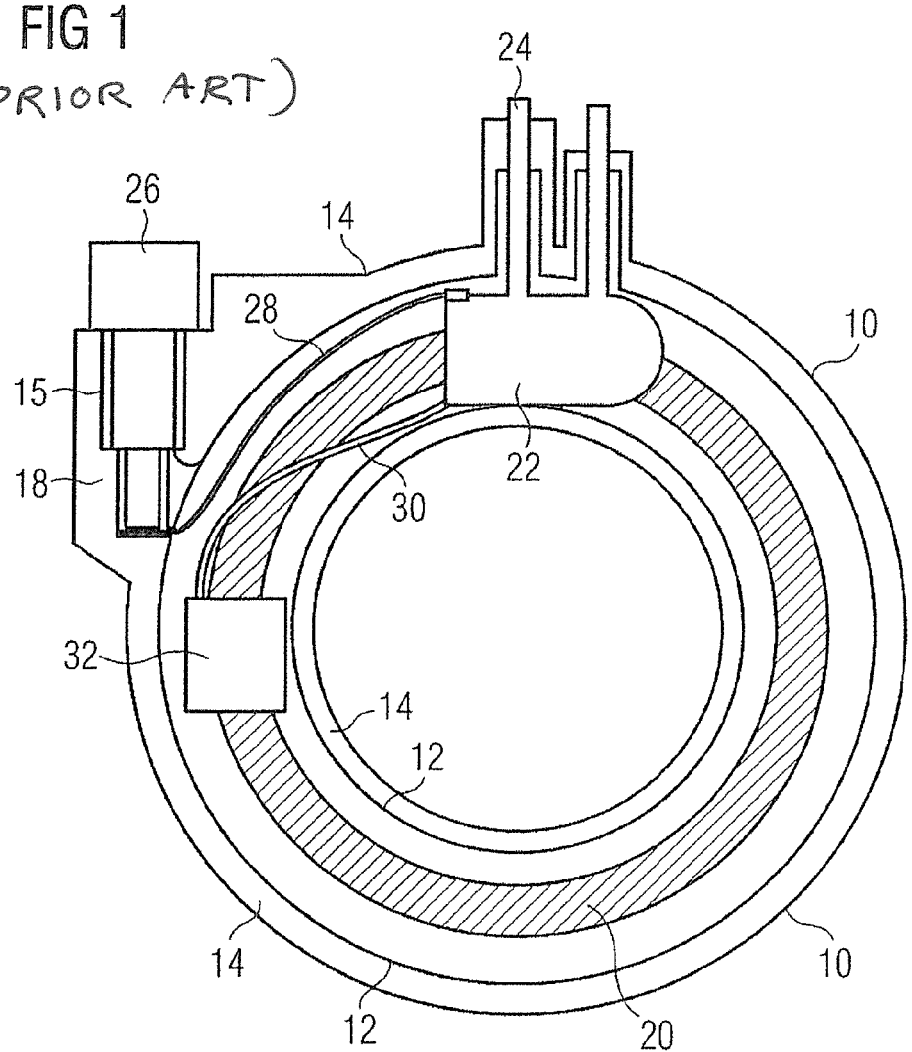
FIG. 1 shows a cross-section of a conventional superconducting magnet apparatus.

For the purposes of promoting an understanding of the principles of the invention, reference will now be made to preferred exemplary embodiments/best mode illustrated in the drawings and specific language will be used to describe the same. It will nevertheless be understood that no limitation of the scope of the invention is thereby intended, and such alterations and further modifications in the illustrated embodiments and such further applications of the principles of the invention as illustrated as would normally occur to one skilled in the art to which the invention relates are included herein.

According to the present exemplary embodiment, a cryogen vessel provided within a local coil cooling arrangement, that is, where superconducting windings are not located within the cryogen vessel, has a high thermal emissivity surface over a substantial portion of its outer surface, with the objective of maximizing absorption of thermal radiation by the cryogen vessel.

According to a structure of the present exemplary embodiment, an outer vacuum chamber (OVC), mechanical supports and one or more thermal radiation shields are provided, as is conventional. The OVC and its vacuum will prevent thermal influx to the superconducting windings by convection. The materials and dimensions of the mechanical supports will minimize thermal influx to the superconducting windings by conduction, and the thermal radiation shield(s) will reduce thermal influx to the superconducting windings by radiation.

However, any thermal radiation which is emitted by the inside of the thermal radiation shield(s) may impinge upon, and be absorbed by, the superconducting windings. According to an example embodiment of the present invention, the cryogen vessel, which is present within the thermal radiation shield(s) along with the superconducting windings, is treated with a high emissivity surface treatment. Such surface treatment ensures that any thermal radiation which impinges upon the cryogen vessel is absorbed by the cryogen vessel and removed from the system by the boiling of the cryogen, itself subsequently recondensed by the refrigerator 26, and will not be reflected onto the superconducting windings 20.

By maximizing the proportion of the thermal radiation within the thermal radiation shield(s) which is intercepted and absorbed by the cryogen vessel, the proportion which is absorbed by the superconducting windings is reduced.

The heat absorbed into the cryogen vessel is then removed by the arrangements provided for cooling the cryogen used, typically a recondensing refrigerator 26 thermally and mechanically linked 28 to the cryogen vessel. The interior surfaces of the thermal radiation shield 12 preferably have a low-emissivity surface, to minimize the thermal energy radiated into the volume within the thermal radiation shield.

In further developments of the invention, the cryogen vessel may be designed with a maximized surface area to improve the proportion of thermal radiation which is absorbed by the cryogen vessel. This may be achieved, for example, by a high-aspect-ratio geometry, by corrugated surfaces, or by more extreme measures such as the provision of fins on its surface. Of course, these approaches may be combined where appropriate.

In certain embodiments, surfaces of the cryogen vessel which have line-of-sight exposure to the superconductor coils may be treated with a low thermal emissivity material, while surfaces not so exposed may be treated with a high thermal emissivity material. This may avoid a problem which may occur where high-emissivity surfaces heat up due to received radiation, and re-radiate heat towards the superconductor coils.

Suitable surface treatments, coatings or materials can be decided upon, depending on materials used to construct the cryogen vessel, assembly techniques and the required mechanical resilience of the surface coating. Many conventional surface treatments for increasing emissivity may be used, as understood by those skilled in the art. Example surface treatments which may be employed may include simple mechanical roughening of the surface such as by wire brushing, paint, such as a matte black paint, anodizing, coating with carbon black (soot). Application of a paint is most likely the simplest method, but problems may arise due to the presence of volatile organic compounds in the vacuum space within the OVC. Such volatile compounds could vaporize and enable convection heat transfer to the superconducting windings.

Figure 2:
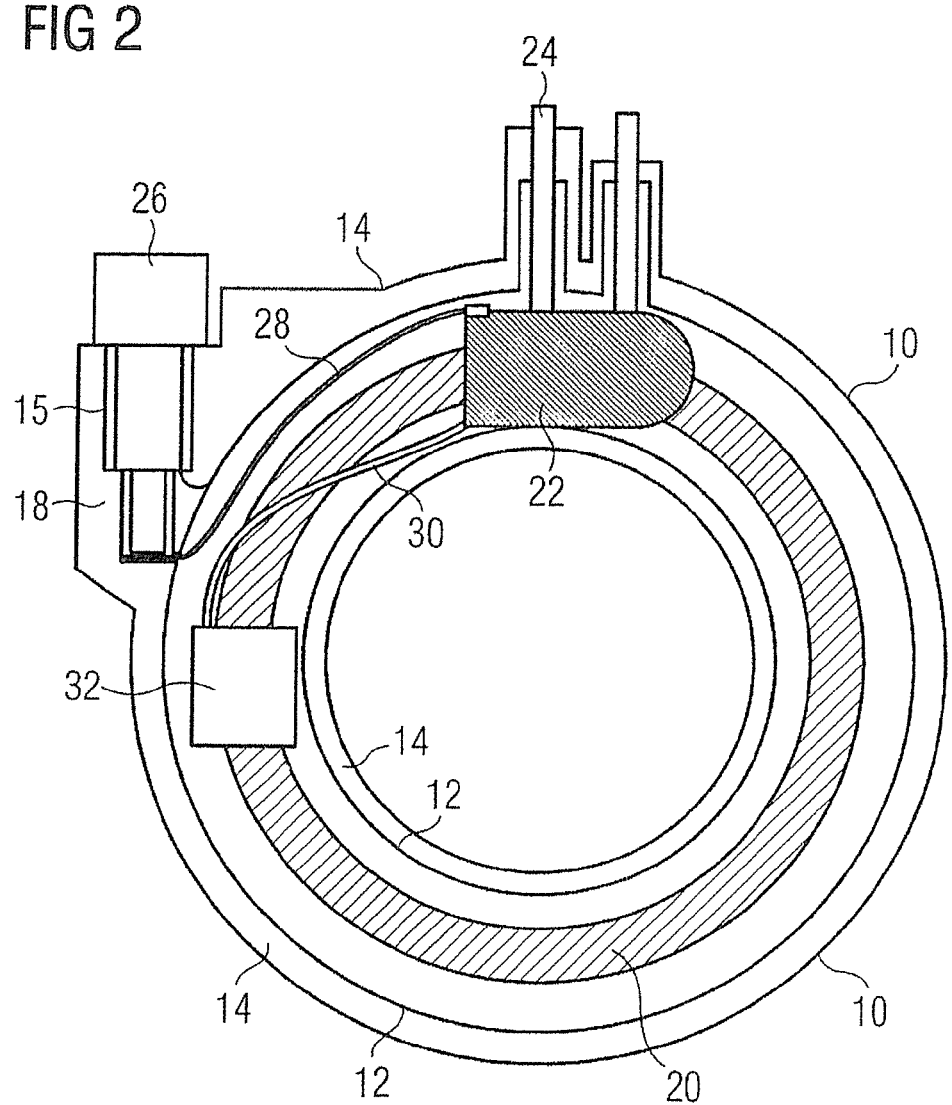
FIGS. 2-6 show corresponding cross-sections of superconducting magnet apparatus according to respective embodiments of the present invention.

FIG. 2 illustrates a cross-section through a superconducting magnet cooling arrangement according to an exemplary embodiment of the present invention. This particular embodiment corresponds to the structure of FIG. 1, except in that at least a substantial part of the outer surface of the cryogen vessel 22 is treated to have a surface of high thermal emissivity, such as black paint, carbon black or black anodised aluminum. This represents the simplest embodiment of the present invention, wherein the cryogen vessel has at least part of its outer surface treated such that it has a higher thermal emissivity than the average thermal emissivity of the surfaces of the superconducting windings.

Figure 3:
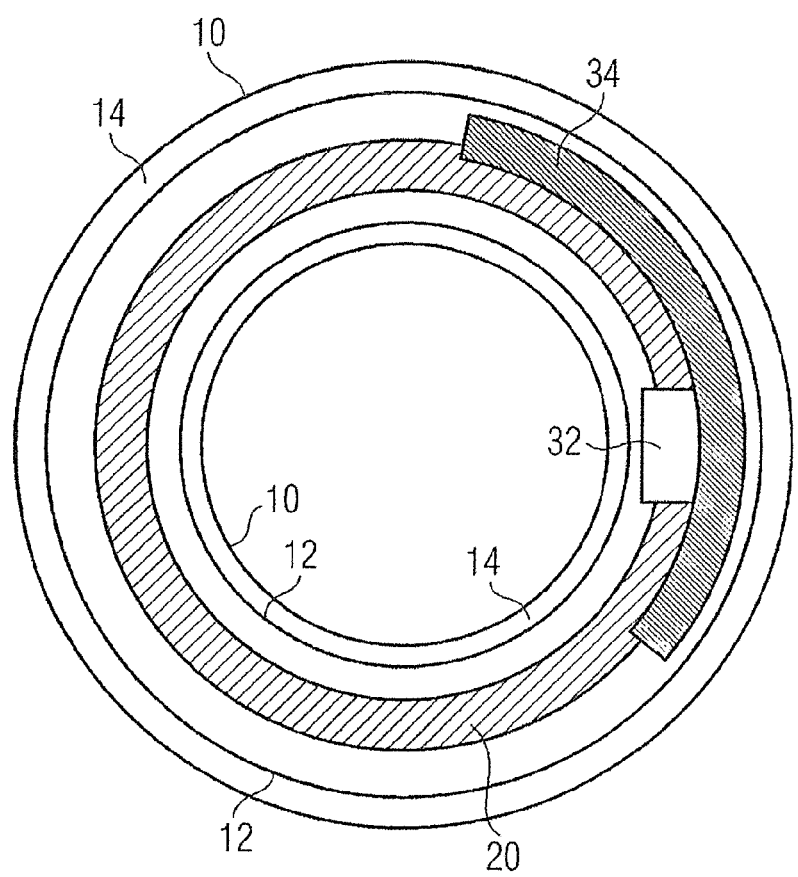

FIG. 3 illustrates a cross-section through a superconducting magnet cooling arrangement according to another exemplary embodiment of the present invention. According to this embodiment, the conventional, essentially cylindrical, or "bullet-shaped" cryogen vessel such as shown in FIGS. 1 and 2 is replaced by a cryogen vessel 34 of much increased surface area. As shown, it is essentially arcuate in radial cross-section, a partial cylinder. By providing such a cryogen vessel, a certain proportion of the superconducting magnet windings 20 are directly shaded from incident thermal radiation by the presence of the cryogen vessel. Furthermore, the increased surface area of the cryogen vessel means that a greater proportion of thermal radiation which enters the interior of the thermal shield 12 will be intercepted by a surface of the cryogen vessel. At least a substantial part of the outer surface of the cryogen vessel 34 is treated to have a high emissivity surface.

Figure 4:
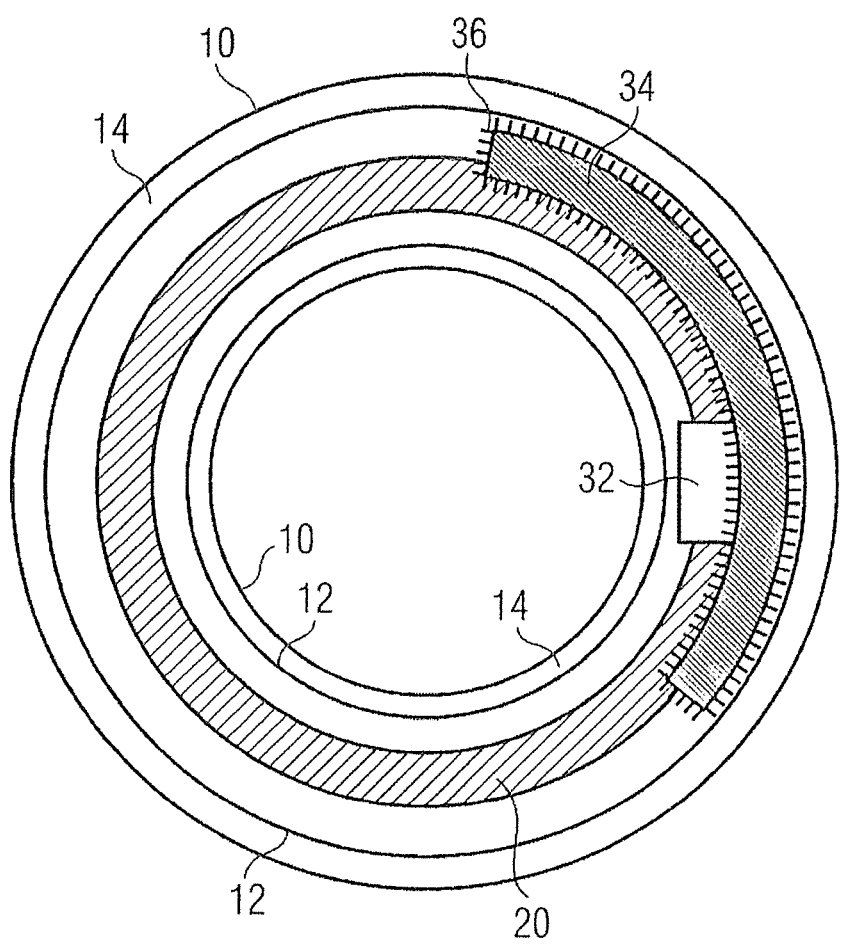

FIG. 4 shows an exemplary further development of the embodiment of FIG. 3, where the surface area of the cryogen vessel is increased. The illustrated example makes use of thermally conductive fins 36 provided in thermal contact with the cryogen vessel and having at least part of their surface treated to provide high thermal emissivity.

Alternatively, or in addition, other suitable arrangements may be provided for increasing the effective surface area of the cryogen vessel. For example, at least part of the surface of the cryogen vessel 34 may be corrugated.

The present exemplary embodiment operates by arranging for the cryogen vessel to have at least part of its surface treated to provide a thermal emissivity which is greater than the average thermal emissivity of the surfaces of the superconducting windings within the thermal radiation shield. In this way, thermal radiation has an increased probability of being absorbed by the cryogen vessel, and being efficiently removed by a cryogenic refrigerator 26 provided to cool the cryogen vessel, rather than being absorbed by superconducting windings 20, where such heating may cause thermal instability and quench. Conventionally, the cryogen vessel would be coated in a low thermal emissivity treatment, which would mean that incident thermal radiation would be reflected away, possibly to be absorbed by the superconducting windings. According to the present exemplary embodiment, incident thermal radiation is preferentially absorbed by the cryogen vessel, reducing the amount of thermal radiation which is absorbed by the superconductor windings 20.

Conventional surface treatments of cryogen vessels, for example, applying a coating of aluminum foil, typically provide a thermal emissivity of less than 0.1. According to the present exemplary embodiment, a substantial part of the surface area of the cryogen vessel will have a surface treatment having a surface thermal emissivity greater than the average thermal emissivity of the superconducting windings by at least 0.1. The thermal emissivity of that substantial part preferably has a thermal emissivity of at least 0.5, more preferably at least 0.8, and more preferably still, at least 0.9. Preferably, the substantial part is at least 30% of the total surface area of the cryogen vessel, and more preferably at least 50%.

According to the present exemplary embodiment, thermal radiation may be preferentially absorbed by the cryogen vessel rather than the superconducting windings 20. This may result in an increased thermal load at the temperature of the liquid cryogen. This may be considered justified to minimize the thermal load onto the superconducting windings While certain examples of high thermal emissivity surface treatments, materials and coatings have been provided in the above description, many others are possible. The material property of thermal emissivity is determined by atomic-level properties, such as chemical composition and surface texture.

A conventional aluminum thermal radiation shield may have a thermal emissivity of about 0.1. Pure clean aluminum at a temperature of about 4K has a thermal emissivity of about 0.01. The thermal emissivity of an aluminum-coated cryogen vessel is similar. The present exemplary embodiment is believed to provide a significant improvement, in that absorption of thermal radiation is markedly increased, provided that the surface emissivity (on its scale of between 0 and 1) of a significant portion of the surface of the cryogen vessel is greater than the average thermal emissivity of the superconducting windings by at least 0.1.

Further examples of suitable materials, treatments or coatings for the cryogen vessel of the present exemplary embodiment include:

Tarnished copper
Brushed stainless steel
Tarnished stainless steel, formed by heating in an oxygen-rich environment
Brushed, sandblasted or grit blasted stainless steel
Charcoal cloth
Cotton cloth
Fine stainless steel wool
Hard black-anodised aluminum
Alumina, flame- or plasma-sprayed onto a stainless steel or aluminum surface.

Some of these treatments may be applied by coating the corresponding surface with an adhesive tape carrying the associated material.

Figure 5:
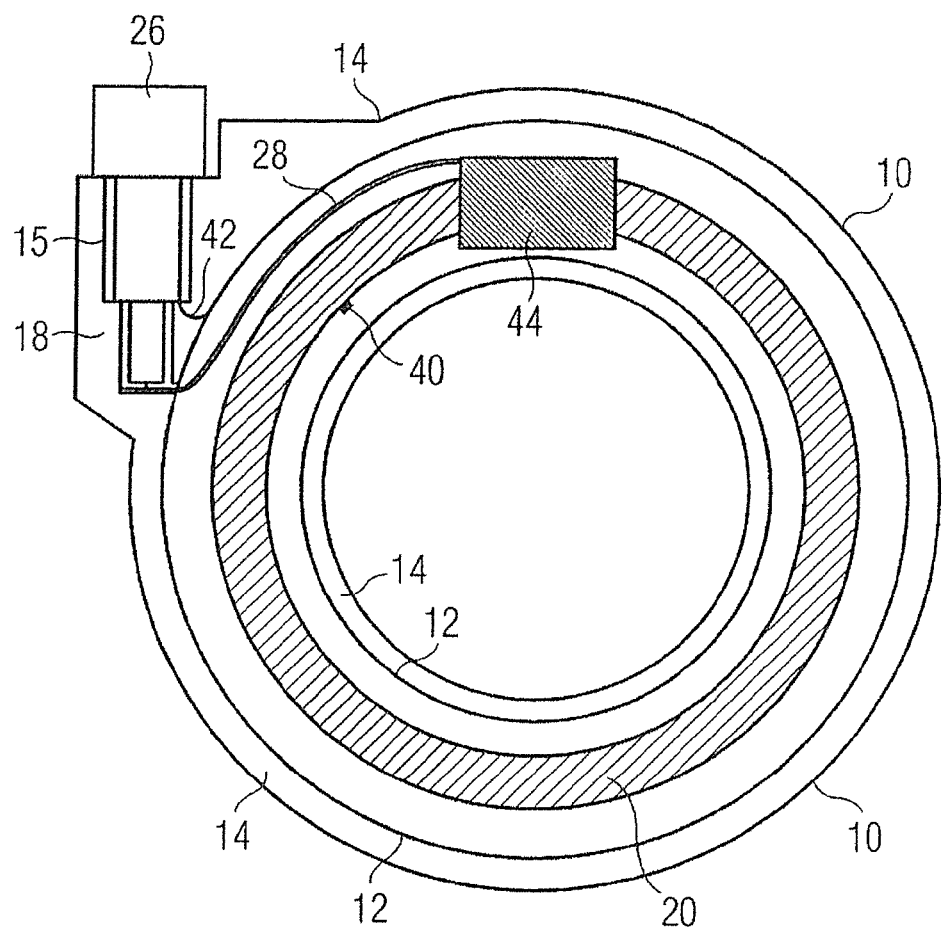
Figure 6:
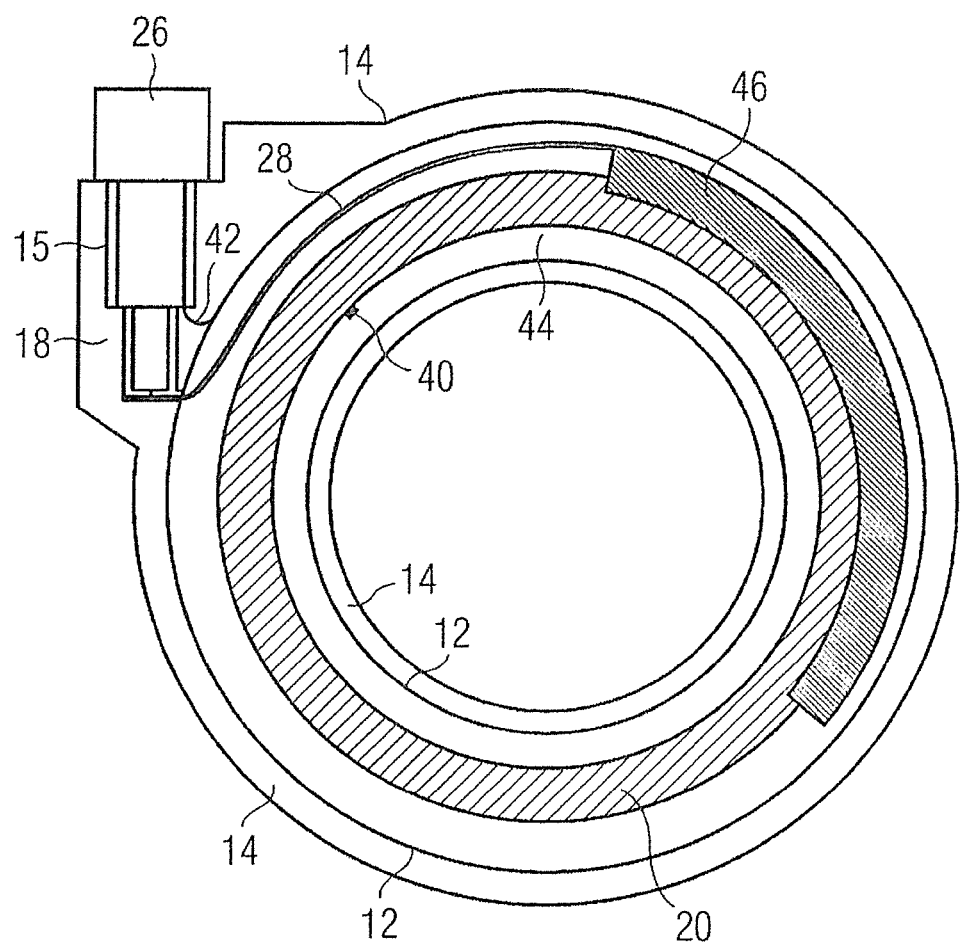

In further embodiments of the present exemplary embodiment, such as illustrated in FIGS. 5-6, a cooling surface may be provided instead of, or in addition to, the cryogen vessel. In some superconducting magnet systems, no cryogen vessel is provided at all. Instead, a solid thermal conductor 28, 40 which may be referred to as a bus-bar, links the refrigerator 26 to the superconducting windings 20. Typically, a two-stage refrigerator is employed, with one bus-bar 42 or braid or similar linking of the first cooling stage to thermal radiation shield(s) 12, and another bus-bar linking of the second cooling stage to the superconducting windings 20.

A cooled surface 44 may be placed within the volume of the thermal radiation shield, with the superconducting windings 20. The cooled surface should be treated over at least part of its surface to have a high emissivity surface, thereby to absorb thermal radiation which may be present within the thermal radiation shield in a manner similar to that described above for thermal radiation vessels.

As illustrated in FIG. 5, the cooled surface 44 may take the form of a cylinder of similar dimensions to the cryogen vessel discussed with reference to FIG. 2. Alternatively, as shown in FIG. 6, the cooled surface 46 may be of any convenient shape, such as planar or arcuate, similar to the cryogen vessel shown in FIG. 4. The cooled surface must be of a material which has good thermal conductivity at cryogenic temperatures, such as aluminum or copper. In one embodiment, the cooled surface may take the form of one or more hoops, located axially between windings 20 of the superconducting magnet. In such a location, the cooled surfaces may absorb thermal radiation within the thermal radiation shield, but their location would prevent them from radiating heat significantly onto superconducting windings 20.

In any arrangement having such a cooled surface, the cooled surface having thermal emissivity at the temperature of operation which is greater than an average surface emissivity of the at least one superconducting winding by at least 0.1 has an area of at least 20% of the surface area of the superconducting windings, and preferably at least 50% of the surface area of the superconducting windings.

Although preferred exemplary embodiments are shown and described in detail in the drawings and in the preceding specification, they should be viewed as purely exemplary and not as limiting the invention. It is noted that only preferred exemplary embodiments are shown and described, and all variations and modifications that presently or in the future lie within the protective scope of the invention should be protected.

I claim as my invention:

1. A superconducting magnet apparatus, comprising:
at least one superconducting winding;
an outer vacuum chamber housing the at least one superconducting winding;
at least one thermal radiation shield located between the at least one superconducting winding and the outer vacuum chamber;
a cryogen vessel positioned within the at least one thermal radiation shield and within the outer vacuum chamber, the at least one superconducting winding being positioned outside of the cryogen vessel;
at least one refrigerator operable to cool the cryogen vessel to a liquid cryogen temperature and arranged to cool the at least one thermal radiation shield to an intermediate temperature between the liquid cryogen temperature and a temperature of the outer vacuum chamber; and
a substantial portion of an outer surface of the cryogen vessel having a thermal emissivity at the liquid cryogen temperature which is greater than an average surface emissivity of the at least one superconducting winding by at least 0.1.

2. The superconducting magnet apparatus according to claim 1 wherein the substantial portion of the outer surface of the cryogen vessel comprises at least 30% of the outer surface of the cryogen vessel.

3. The superconducting magnet apparatus according to claim 2 wherein the substantial portion of the outer surface of the cryogen vessel comprises at least 50% of the outer surface of the cryogen vessel.

4. The superconducting magnet apparatus according to claim 1 wherein the thermal emissivity of the substantial portion of the outer surface of the cryogen vessel at the liquid cryogen temperature is at least 0.5.

5. The superconducting magnet apparatus according to claim 4 wherein the thermal emissivity of the substantial portion of the outer surface of the cryogen vessel at the liquid cryogen temperature is at least 0.8.

6. The superconducting magnet apparatus according to claim 5 wherein the thermal emissivity of the substantial portion of the outer surface of the cryogen vessel at the liquid cryogen temperature is at least 0.9.

7. The superconducting magnet apparatus according to claim 1 wherein the outer surface of the cryogen vessel is corrugated.

8. The superconducting magnet apparatus according to claim 1 wherein the outer surface of the cryogen vessel is provided with thermally conductive fins having at least part of their surface treated to provide high thermal emissivity.

9. The superconducting magnet apparatus according to claim 1 wherein parts of said outer surface of the cryogen vessel which have line-of-sight exposure to the superconductor windings have a relatively low thermal emissivity surface at the liquid cryogen temperature, while parts of said outer surface not so exposed have a higher thermal emissivity at the liquid cryogen temperature, and being greater than an average surface emissivity of the at least one superconducting winding by at least 0.1.

10. The superconducting magnet apparatus, comprising:
    at least one superconducting winding;
    an outer vacuum chamber housing the at least one superconducting winding;
    at least one thermal radiation shield located between the at least one superconducting winding and the outer vacuum chamber;
    a cooled surface positioned within the at least one thermal radiation shield and within the outer vacuum chamber;
    at least one refrigerator operable to cool the cooled surface to cool the at least one superconducting winding to a temperature at which superconductivity is possible and to cool the at least one thermal radiation shield to an intermediate temperature between a temperature of the superconducting winding and a temperature of the outer vacuum chamber; and
    a substantial portion of the cooled surface having a thermal emissivity at the liquid cryogen temperature which is greater than an average surface emissivity of the at least one superconducting winding by at least 0.1.

11. The superconducting magnet apparatus according to claim 10 wherein the substantial portion of the cooled surface has a surface area of at least 20% of a surface area of the superconducting winding.

12. The superconducting magnet apparatus according to claim 11 wherein the substantial portion of the cooled surface has a surface area of at least 50% of the surface area of the superconducting winding.

13. The superconducting magnet apparatus according to claim 10 wherein the thermal emissivity of the substantial portion of the cooled surface is at least 0.5.

14. The superconducting magnet apparatus according to claim 13 wherein the thermal emissivity of the substantial portion of the cooled surface is at least 0.8.

15. The superconducting magnet apparatus according to claim 14 wherein the thermal emissivity of the substantial portion of the outer surface of the cooled surface at the liquid cryogen temperature is at least 0.9.

16. The superconducting magnet apparatus according to claim 10 wherein the cooled surface is corrugated.

17. The superconducting magnet apparatus according to claim 10 wherein the cooled surface is provided with thermally conductive fins having at least part of their surface treated to provide high thermal emissivity.

18. The superconducting magnet apparatus according to claim 10 wherein parts of the cooled surface which have line-of-sight exposure to the superconductor windings have a relatively low thermal emissivity, while parts of the cooled surface not so exposed have a higher thermal emissivity, and being greater than an average surface emissivity of the at least one superconducting winding by at least 0.1.

\* \* \* \* \*